US010950323B2

(12) United States Patent
Xiong et al.

(10) Patent No.: US 10,950,323 B2
(45) Date of Patent: Mar. 16, 2021

(54) SHIFT REGISTER UNIT, CONTROL METHOD THEREOF, GATE DRIVING DEVICE, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xiong Xiong, Beijing (CN); Xiaozhe Zhang, Beijing (CN); Yudong Liu, Beijing (CN); Jianjun Wang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 162 days.

(21) Appl. No.: 16/244,499

(22) Filed: Jan. 10, 2019

(65) Prior Publication Data

US 2019/0318796 A1    Oct. 17, 2019

(30) Foreign Application Priority Data

Apr. 16, 2018    (CN) .......................... 201810340015.0

(51) Int. Cl.
*G11C 19/00*      (2006.01)
*G11C 19/28*      (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,098,792 B2 *  1/2012  Hsu ...................... G09G 3/3677
                                                        377/64
8,331,524 B2 * 12/2012  Hsu ...................... G11C 19/28
                                                        377/64
(Continued)

FOREIGN PATENT DOCUMENTS

CN        101644867 A       2/2010
CN        102201214 A       9/2011
(Continued)

OTHER PUBLICATIONS

First Office Action and English language translation, CN Application No. 201810340015.0, dated Jan. 20, 2020, 25 pp.

*Primary Examiner* — Tuan T Lam
(74) *Attorney, Agent, or Firm* — Myers Bigel, P.A.

(57) ABSTRACT

A shift register unit is provided, which includes an input circuit, a first output circuit and a first output signal adjustment circuit. The input circuit is configured for receiving an input signal from an input terminal and controlling an electrical signal of a first node based on the input signal. The first output circuit is configured for outputting a first output signal at a first output terminal of the shift register unit based on a first clock signal under control of the electrical signal of the first node. The first output signal adjustment circuit is configured for providing a first reference signal to the first output terminal under control of the second clock signal so as to decrease an amplitude of the first output signal.

16 Claims, 7 Drawing Sheets

(51) Int. Cl.
  *G09G 3/20* (2006.01)
  *G09G 3/36* (2006.01)
(52) U.S. Cl.
  CPC .............. *G09G 2300/0408* (2013.01); *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 2008/0088555 | A1* | 4/2008 | Shin | H03K 17/16 345/87 |
| 2008/0219401 | A1* | 9/2008 | Tobita | G11C 19/28 377/79 |
| 2011/0058640 | A1* | 3/2011 | Shang | G11C 19/184 377/64 |
| 2012/0262497 | A1 | 10/2012 | Chang | |
| 2014/0086379 | A1* | 3/2014 | Ma | H03K 5/00 377/64 |
| 2014/0098013 | A1* | 4/2014 | Chen | G09G 3/3677 345/92 |
| 2014/0176410 | A1* | 6/2014 | Ma | H03K 3/012 345/92 |
| 2014/0219412 | A1 | 8/2014 | Chien et al. | |
| 2015/0302935 | A1* | 10/2015 | Zeng | G11C 19/28 377/64 |
| 2015/0339999 | A1* | 11/2015 | Zheng | G09G 3/3677 345/92 |
| 2017/0011699 | A1* | 1/2017 | Wang | G11C 19/28 |
| 2017/0162166 | A1 | 6/2017 | Kang et al. | |
| 2018/0190227 | A1* | 7/2018 | Feng | G09G 3/3674 |
| 2018/0335814 | A1 | 11/2018 | Shao et al. | |
| 2019/0080661 | A1* | 3/2019 | Zhao | G11C 19/28 |

FOREIGN PATENT DOCUMENTS

| | | |
|---|---|---|
| CN | 103366822 A | 10/2013 |
| CN | 105895045 A | 8/2016 |
| CN | 105957470 A | 9/2016 |
| CN | 106057147 A | 10/2016 |
| CN | 107731180 A | 2/2018 |
| JP | 2014-157638 A | 8/2014 |

* cited by examiner

SHIFT REGISTER UNIT, CONTROL METHOD THEREOF, GATE DRIVING DEVICE, DISPLAY DEVICE

CROSS REFERENCE TO RELATED APPLICATIONS

This U.S. non-provisional patent application claims priority under 35 U.S.C. § 119 to Chinese Patent Application No. 201810340015.0, filed on Apr. 16, 2018, the entire disclosure of which is incorporated herein by reference.

TECHNICAL FIELD

The present disclosure relates to the field of display technologies, and particularly to a shift register unit, a control method thereof, a gate driving device, an array substrate, and a display device.

BACKGROUND

In order to pursue low cost and narrow bezel of a display device, more and more display panel products employ GOA (Gate Driver On Array) technology, that is, a thin film transistor (TFT) gate driving circuit is fabricated directly on the array substrate, which avoids the space occupied by IC bonding and fan-out areas, so that the costs in materials, preparation processes, etc. are reduced and the bezels at two sides of a display panel are narrowed.

Compared with COG (chip on glass) and COF (chip on film) technologies, the GOA technology has unparalleled advantages in narrow bezel application and cost reduction. Currently, it has been widely used in products such as mobile phone, Touch PC and notebook.

SUMMARY

Embodiments of the present disclosure propose a shift register unit, a control method thereof, a gate driving device, an array substrate, and a display device.

A shift register unit provided by an embodiment of the application comprises: an input circuit having a first terminal electrically connected to an input terminal of the shift register unit and a second terminal electrically connected to a first node, wherein the input circuit is configured for receiving an input signal from the input terminal and controlling an electrical signal of the first node based on the input signal; a first output circuit having a first terminal electrically connected to the first node, a second terminal used for receiving a first clock signal and a third terminal electrically connected to a first output terminal of the shift register unit, wherein the first output circuit is configured for outputting a first output signal at the first output terminal based on the first clock signal under control of the electrical signal of the first node; a first output signal adjustment circuit having a first terminal used for receiving a second clock signal, a second terminal electrically connected to the first output terminal and a third terminal electrically connected to a first reference signal terminal, wherein the first output signal adjustment circuit is configured for providing a first reference signal of the first reference signal terminal to the first output terminal under control of the second clock signal so as to decrease an amplitude of the first output signal, wherein a polarity of the first reference signal is opposite to that of the first output signal.

In some embodiments, the first output signal adjustment circuit comprises a first transistor, a control terminal of the first transistor being used for receiving the second clock signal, a first terminal of the first transistor being electrically connected to the first output terminal, and a second terminal of the first transistor being electrically connected to the first reference signal terminal.

In some embodiments, an amplitude of an effective level of the second clock signal is smaller than an amplitude of an effective level of the first clock signal, and a duty cycle of the second clock signal is smaller than that of the first clock signal.

In some embodiments, at least some falling edges of the effective level of the second clock signal are synchronized with falling edges of the effective level of the first clock signal.

In some embodiments, at least some rising edges of the effective level of the second clock signal are synchronized with rising edges of the effective level of the first clock signal.

In some embodiments, the shift register unit further comprises a second output circuit, the second output circuit having a first terminal used for receiving the first clock signal, a second terminal electrically connected to the first node and a third terminal electrically connected to a second output terminal of the shift register unit, the second output circuit is configured for outputting a second output signal at the second output terminal based on the first clock signal under control of the electrical signal of the first node.

In some embodiments, the second output circuit comprises a second transistor, a control terminal of the second transistor being electrically connected to the first node, a first terminal of the second transistor being used for receiving the first clock signal, and a second terminal of the second transistor being electrically connected to the second output terminal.

In some embodiments, the input circuit comprises a fifth transistor, a control terminal and a first terminal of the fifth transistor being both electrically connected to the input terminal, and a second terminal thereof being electrically connected to the first node.

In some embodiments, the first output circuit comprises a sixth transistor and a capacitor, a control terminal of the sixth transistor being electrically connected to the first node, a first terminal of the sixth transistor being used for receiving the first clock signal, a second terminal of the sixth transistor being electrically connected to the first output terminal, a first terminal of the capacitor being electrically connected to the first node, and a second terminal of the capacitor being electrically connected to the first output terminal.

In some embodiments, the shift register unit further comprises a pull-down control circuit that has a first terminal electrically connected to a second node, a second terminal used for receiving a third clock signal, a third terminal electrically connected to the first reference signal terminal and a fourth terminal electrically connected to the first node, the pull-down control circuit is configured for generating an electrical signal of the second node under control of the electrical signal of the first node so that the electrical signal of the second node is equal to the third clock signal or the first reference signal.

In some embodiments, the pull-down control circuit comprises a seventh transistor, an eighth transistor, a ninth transistor, and a tenth transistor, a control terminal of the seventh transistor being electrically connected to a second terminal of the ninth transistor, a first terminal of the seventh transistor being used for receiving the third clock signal, a second terminal of the seventh transistor being electrically connected to the second node, a control terminal of the eighth transistor being electrically connected to the first node, a first terminal of the eighth transistor being electrically connected to the second node, a second terminal of the eighth transistor being electrically connected to the first reference signal terminal, a control terminal and a first terminal of the ninth transistor being used for receiving the third clock signal, the second terminal of the ninth transistor being electrically connected to a first terminal of the tenth transistor, a control terminal of the tenth transistor being electrically connected to the first node, and a second terminal of the tenth transistor being electrically connected to the first reference signal terminal.

In some embodiments, the shift register unit further comprises a first reset circuit that has a first terminal used for receiving a reset signal, a second terminal electrically connected to the first node, a third terminal electrically connected to the second node and a fourth terminal electrically connected to the first reference signal terminal, the first reset circuit is configured for resetting the first node with the first reference signal under control of the electrical signal of the second node and the reset signal.

In some embodiments, the first reset circuit comprises an eleventh transistor and a twelfth transistor, a control terminal of the eleventh transistor being used for receiving the reset signal, a first terminal of the eleventh transistor being electrically connected to the first node, a second terminal of the eleventh transistor being electrically connected to the first reference signal terminal, a control terminal of the twelfth transistor being electrically connected to the second node, a first terminal of the twelfth transistor being electrically connected to the first node, and a second terminal of the twelfth transistor being electrically connected to the first reference signal terminal.

In some embodiments, the shift register unit further comprises a second reset circuit that has a first terminal electrically connected to the second node, a second terminal electrically connected to the first output terminal, a third terminal used for receiving the reset signal, and a fourth terminal electrically connected to the first reference signal terminal, the second reset circuit is configured for resetting the first output terminal with the first reference signal under control of the electrical signal of the second node and the reset signal.

In some embodiments, the second reset circuit comprises a thirteenth transistor and a fourteenth transistor, a control terminal of the thirteenth transistor being electrically connected to the second node, a first terminal of the thirteenth transistor being electrically connected to the first output terminal, a second terminal of the thirteenth transistor being electrically connected to the first reference signal terminal, a control terminal of the fourteenth transistor being used for receiving the reset signal, a first terminal of the fourteenth transistor being electrically connected to the first output terminal, and a second terminal of the fourteenth transistor being electrically connected to the first reference signal terminal.

In some embodiments, the shift register unit further comprises a third reset circuit that has a first terminal electrically connected to the second output terminal, a second terminal electrically connected to the second node, a third terminal used for receiving the reset signal, and a fourth terminal electrically connected to the first reference signal terminal, the third reset circuit is configured for resetting the second output terminal with the first reference signal under control of the electrical signal of the second node and the reset signal.

In some embodiments, the third reset circuit comprises a third transistor and a fourth transistor, a control terminal of the third transistor being used for receiving the reset signal, a first terminal of the third transistor being electrically connected to the second output terminal, a second terminal of the third transistor being electrically connected to the first reference signal terminal, a control terminal of the fourth transistor being electrically connected to the second node, a first terminal of the fourth transistor being electrically connected to the second output terminal, and a second terminal of the fourth transistor being connected to the first reference signal terminal.

Another embodiment of the disclosure provides a gate driving device comprising a plurality of cascaded shift register units as described in any of the foregoing embodiments.

In some embodiments, the shift register unit further comprises a second output circuit that has a first terminal used for receiving the first clock signal, a second terminal electrically connected to the first node and a third terminal electrically connected to a second output terminal of the shift register unit, the second output circuit is configured for outputting a second output signal at the second output terminal based on the first clock signal under control of the electrical signal of the first node. A second output terminal of a N-th stage shift register unit among the plurality of cascaded shift register units is electrically connected to an input terminal of a (N+1)-th stage shift register unit.

A further embodiment of the present disclosure provides an array substrate comprising the gate driving device as described in any of the foregoing embodiments.

Yet another embodiment of the present disclosure provides a display device comprising the array substrate as described in the foregoing embodiment.

A further embodiment of the present disclosure provides a control method for a shift register unit as described in the foregoing embodiments, comprising:

providing an input signal to the input terminal of the shift register unit so that the input signal is transmitted to the first node via the input circuit; providing a first clock signal to the second terminal of the first output circuit so that the first output terminal of the shift register unit generates a first output signal based on the first clock signal under control of the electrical signal of the first node; and providing a second clock signal to the first terminal of the first output signal adjustment circuit, so that the first reference signal of the first reference signal terminal is provided to the first output terminal under control of the second clock signal so as to decrease the amplitude of the first output signal.

DETAILED DESCRIPTION

To make the objective, technical solutions and advantages of the present disclosure clearer, the present disclosure will be further described in detail below in conjunction with specific embodiments with reference to the accompanying drawings.

It is to be noted that all the expressions involving "first" and "second" in embodiments of the present disclosure intend to distinguish two non-identical entities or non-identical parameters having the same name. As can be seen, the terms such as "first" and "second" are merely for convenience of description, and should not be construed as limiting embodiments of the disclosure, which will not be explained in the following embodiments.

When preparing a thin film transistor (TFT) in a TFT-LCD, a gate insulating layer is usually formed between the gate and the source of the thin film effect transistor, and the gate insulating layer causes a gate-source capacitor Cgs between the gate and the source while insulating the gate from the source. The gate-source capacitor Cgs is a parasitic capacitance, i.e. an objectively existing capacitance, although useless. When the voltage on a scan line is a turn-on voltage VGH, that is, the gate voltage Vgate of the thin film transistor is a turn-on voltage VGH, the pixel electrode is charged, and the gate-source capacitor is also charged. When the voltage on the scan line is switched from the turn-on voltage VGH to a turn-off voltage VGL, that is, when the gate voltage Vgate is switched from the turn-on voltage VGH to the turn-off voltage VGL, the TFT is turned off, the pixel electrode stops being charged, and charges are redistributed among the capacitors such as a liquid crystal capacitor Clc, a storage capacitor Cst and the gate-source capacitor Cgs. The gate voltage signal may be a square wave signal, the turn-on voltage VGH may refer to a high level in the square wave signal, and the turn-off voltage VGL may refer to a low level in the square wave signal. Due to the influence of the gate-source capacitor Cgs, the voltage of the pixel electrode may be lowered or pulled down, and a transition voltage ΔVp is generated. The value of the transition voltage ΔVp can be calculated by the following formula:

$$\Delta Vp = Cgs*(VGH-VGL)/(Cgs+Cst+Clc)$$

The inventors of the present application realized that if the value of the transition voltage ΔVp is large, the liquid crystal display is prone to flickers, broken images, and the like, which seriously affects the image quality of the liquid crystal display.

Figure 1:
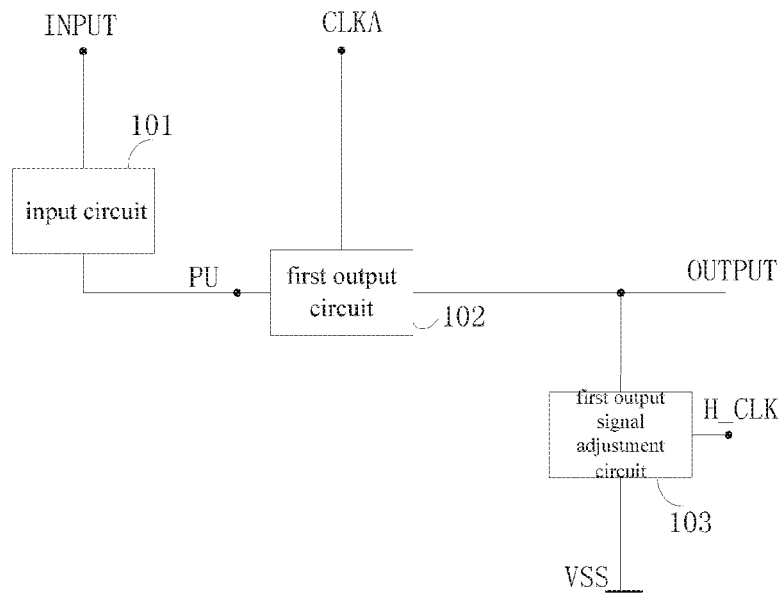
FIG. 1 is a structural block diagram of a shift register unit provided by an embodiment of the present disclosure.

An embodiment of the disclosure proposes a shift register unit which is capable of improving the quality of displayed images to some extent. FIG. 1 is a schematic structural diagram of a shift register unit provided by an embodiment of the disclosure.

As shown in FIG. 1, the shift register unit comprises: an input circuit 101, a first terminal of which is electrically connected to an input terminal INPUT of the shift register unit, and a second terminal of which is electrically connected to a first node PU, for receiving an input signal from the input terminal INPUT and controlling an electrical signal of the first node PU based on the input signal; a first output circuit 102, a first terminal of which is electrically connected to the first node PU, a second terminal of which is used for receiving a first clock signal CLKA, and a third terminal of which is electrically connected to a first output terminal OUTPUT of the shift register unit, for outputting a first output signal at the first output terminal OUTPUT based on the first clock signal CLKA under the control of the electrical signal of the first node PU; a first output signal adjustment circuit 103, a first terminal of which is used for receiving a second clock signal H_CLK, a second terminal of which is electrically connected to the first output terminal OUTPUT, and a third terminal of which is electrically connected to a first reference signal terminal VSS, for providing a first reference signal of the first reference signal terminal VSS to the first output terminal OUTPUT under the control of the second clock signal H_CLK to decrease the amplitude of the first output signal. The polarity of the first reference signal is opposite to that of the first output signal.

For the shift register unit provided by the embodiment of the disclosure, the first output signal adjustment circuit can provide the first reference signal to the first output terminal of the shift register unit under the control of the second clock signal. Since the polarity of the first reference signal is opposite to that of the first output signal, the amplitude of the first output signal is decreased. Thus, the transition voltage ΔVp for the display device can be effectively reduced, which helps to alleviate the phenomena such as flickers, broken images, and the like that may occur in the display device upon image display, thereby improving the display quality of the display device.

For the first output signal adjustment circuit in the shift register unit proposed by the embodiment of the disclosure, it may be implemented in different ways. The first output signal adjustment circuit may comprise a switching circuit including a switching element. In an embodiment, the first output signal adjustment circuit comprises a first transistor. A control terminal of the first transistor is used for receiving the second clock signal, a first terminal thereof is electrically connected to the first output terminal, and a second terminal thereof is electrically connected to the first reference signal terminal.

Figure 7:
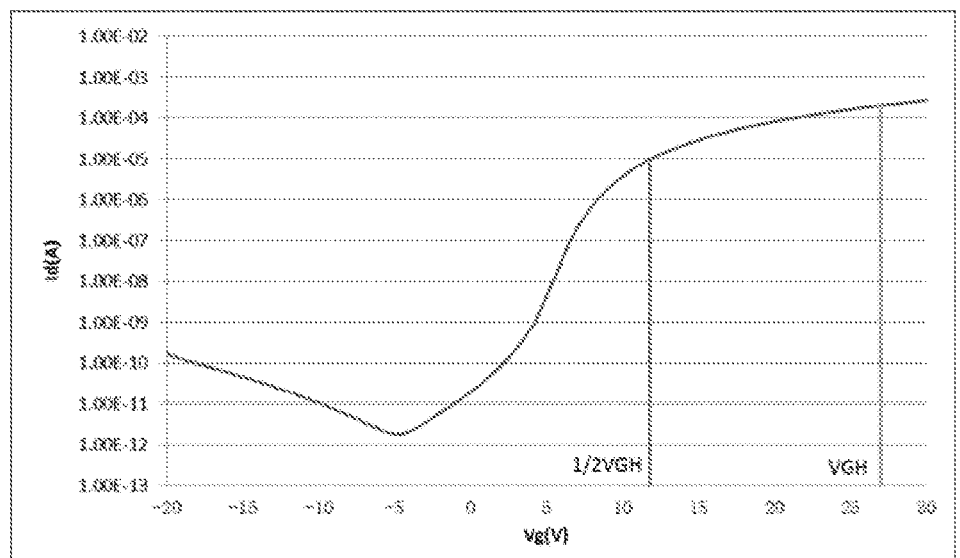
FIG. 7 is a schematic view showing a transfer characteristic curve of a thin film transistor.

FIG. 7 shows a transfer characteristic curve of a transistor. The abscissa of FIG. 7 represents a gate-source voltage Vg of the transistor, and the ordinate represents a source-drain current Id. In FIG. 7, VGH represents a threshold value of the gate-source voltage that causes the transistor to transition from a saturation region to a linear region. In case the gate-source voltage Vg is approximately half of the value of VGH, the transistor transitions from a sub-threshold region to the saturation region. Therefore, in an example, the threshold value Von of the gate-source voltage that causes the transistor to enter the saturation region is approximately VGH/2. In an embodiment, VGH is the amplitude of an effective level of the first clock signal CLKA, and the amplitude of an effective level of the second clock signal H_CLK is half the amplitude of the effective level of the first clock signal CLKA.

Figure 2:
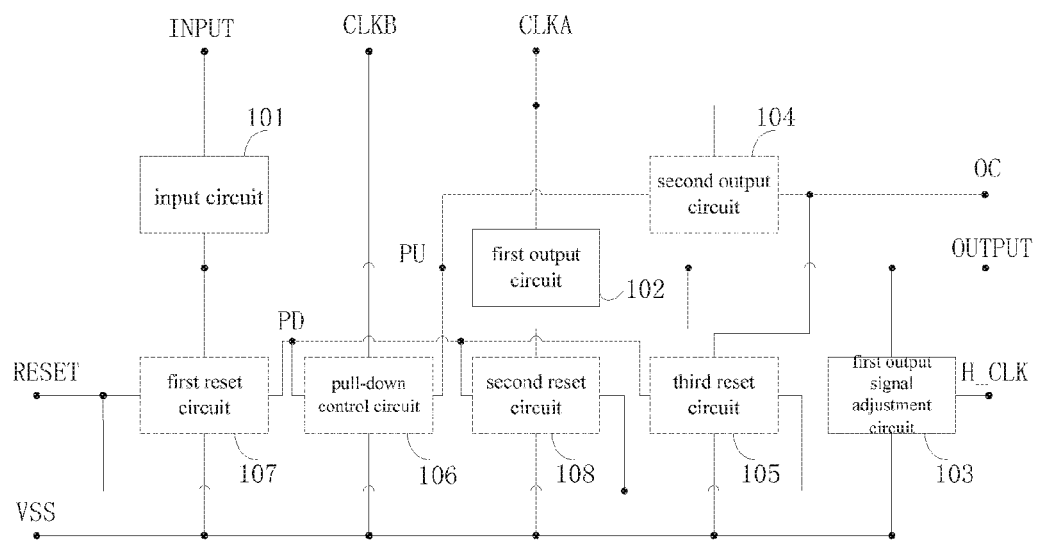
FIG. 2 is a circuit block diagram of a shift register unit provided by another embodiment of the present disclosure.

FIG. 2 shows a structural block diagram of a shift register unit provided by another embodiment of the disclosure. As shown in FIG. 2, the shift register unit further comprises a second output circuit 104, a first terminal of which is used for receiving a first clock signal CLKA, a second terminal of which is electrically connected to the first node PU, and a third terminal of which is electrically connected to a second output terminal OC of the shift register unit, for outputting a second output signal at the second output terminal based on the first clock signal CLKA under the control of the electrical signal of the first node PU. The second output signal generated by the second output circuit 104 would not affected by the first output signal adjustment circuit, and the second output signal may be provided to a next stage shift register unit. Therefore, the second output signal may be used instead of the first input signal as an input signal of a next stage shift register unit, which ensures that the input signal of the next stage shift register unit would not affected by the first output signal adjustment circuit.

According to an embodiment of the disclosure, the second output circuit may comprise a switching device such as a thin film transistor. For example, it may comprise a second transistor. A control terminal of the second transistor is electrically connected to the first node, a first terminal thereof is used for receiving the first clock signal, and the second terminal thereof is electrically connected to the second output terminal.

As shown in FIG. 2, according to some embodiments of the present disclosure, the shift register unit further comprises a pull-down control circuit 106, a first terminal of which is electrically connected to a second node PD, a second terminal of which is used for receiving a third clock signal CLKB, a third terminal of which is electrically connected to the first reference signal terminal VSS, and a fourth terminal of which is electrically connected to the first node PU, for generating an electrical signal of the second node PD under the control of the electrical signal of the first node PU, such that the electrical signal of the second node PD is equal to the third clock signal or the first reference signal.

Further, in some embodiments, the shift register unit further comprises a first reset circuit 107, a second reset circuit 108, and a third reset circuit 105. A first terminal of the first reset circuit 107 is used for receiving a reset signal RESET, a second terminal thereof is electrically connected to the first node PU, a third terminal thereof is electrically connected to the second node PD, and a fourth terminal thereof is electrically connected to the first reference signal terminal VSS, for resetting the first node PU with the first reference signal under the control of the electrical signal of the second node PD and the reset signal RESET. A first terminal of the second reset circuit 108 is electrically connected to the second node PD, a second terminal thereof is electrically connected to the first output terminal OUTPUT, a third terminal thereof is used for receiving the reset signal RESET, and a fourth terminal thereof is electrically connected to the first reference signal terminal VSS, for resetting the first output terminal OUTPUT with the first reference signal under the control of the electrical signal of the second node PD and the reset signal RESET. A first terminal of the third reset circuit 105 is electrically connected to the second output terminal OC, a second terminal thereof is electrically connected to the second node PD, a third terminal thereof is used for receiving the reset signal RESET, and a fourth terminal thereof is electrically connected to the first reference signal terminal VSS, for resetting the second output terminal OC with the first reference signal under the control of the electrical signal of the second node PD and the reset signal RESET.

Figure 3:
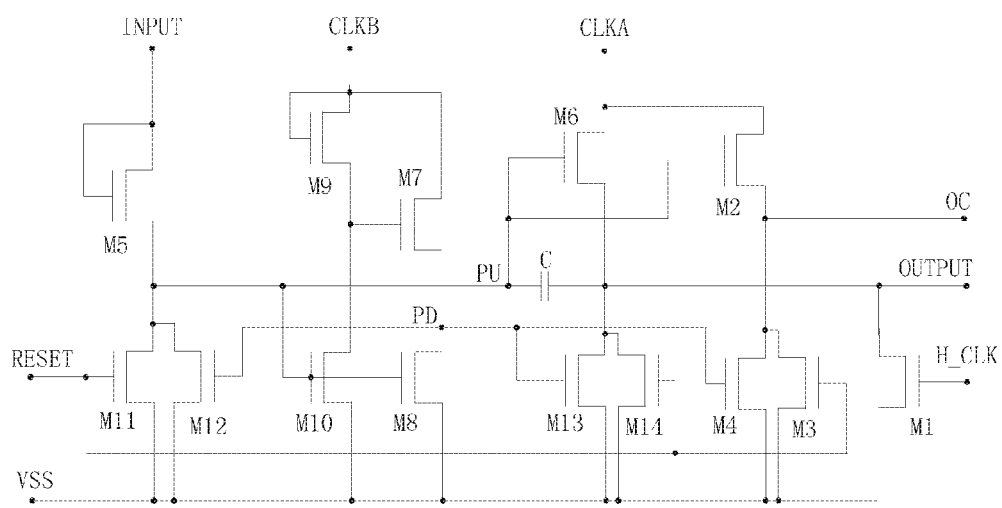
FIG. 3 is an exemplary circuit diagram of a shift register unit provided by an embodiment of the present disclosure.

Hereinafter, a specific circuit of the shift register unit provided by an embodiment of the disclosure will be described by way of example. FIG. 3 shows an exemplary circuit configuration of a shift register unit provided by an embodiment of the present disclosure. For FIG. 3, description is made based on an example in which each transistor is an N-type transistor. As is well known to those skilled in the art, an N-type transistor is turned on when its gate is provided with a high level.

As shown in FIG. 3, according to some embodiments of the present disclosure, for example, the input circuit 101 comprises a fifth transistor M5. A control terminal and a first terminal of the fifth transistor M5 are both electrically connected to the input terminal INPUT, and a second terminal thereof is electrically connected to the first node PU. When the input signal of the input terminal INPUT is at a high level, the fifth transistor M5 is turned on to transmit the input signal of the input terminal INPUT to the first node PU.

According to some embodiments of the disclosure, the first output circuit 102 comprises a sixth transistor M6 and a capacitor C. A control terminal of the sixth transistor M6 is electrically connected to the first node PU, a first terminal thereof is electrically connected to the first clock signal terminal CLKA, and a second terminal thereof is electrically connected to the first output terminal OUTPUT. A first terminal of the capacitor C is electrically connected to the first node PU, and a second terminal thereof is electrically connected to the first output terminal OUTPUT. When the electrical signal at the first node PU is at a high level, the sixth transistor M6 is turned on to output the first clock signal of the first clock signal terminal CLKA to the first output terminal OUTPUT.

According to some embodiments of the present disclosure, the first output signal adjustment circuit 103 comprises a first transistor M1. A control terminal of the first transistor M1 is electrically connected to the second clock signal terminal H_CLK, a first terminal thereof is electrically connected to the first output terminal OUTPUT, and a second terminal thereof is electrically connected to the first reference signal terminal VSS. When the second clock signal of the second clock signal terminal H_CLK is at an effective level, the first transistor M1 is in a turn-on state. For example, as described above, when the amplitude of the effective level of the second clock signal is ½ of the amplitude of the effective level of the first clock signal, the first transistor begins to enter a saturated state, and the first reference signal will be transmitted to the first output terminal, so the amplitude of the first output signal of the first output terminal OUTPUT will be reduced under the effect of the first reference signal. In some embodiments, the amplitude of the first output signal is pulled down for only a small period of time such that a gap is formed in the waveform of the first output signal. Therefore, in this case, the amplitude of the first output signal being pulled down is also referred to as being chamfered, as described in detail below in conjunction with FIGS. 4A and 4B.

According to some embodiments of the disclosure, the second output circuit 104 comprises a second transistor M2. A control terminal of the second transistor M2 is electrically connected to the first node PU, a first terminal thereof is electrically connected to the first clock signal terminal CLKA, and a second terminal thereof is electrically connected to the second output terminal OC. When the electrical signal of the first node PU is at a high level, the second transistor M2 is turned on, and at that time, the second output terminal OC provides a second output signal which is not affected by the first output signal adjustment circuit and is consistent with the first output signal.

According to some embodiments of the present disclosure, the third reset circuit 105 comprises a third transistor M3 and a fourth transistor M4. A control terminal of the third transistor M3 is electrically connected to the reset signal terminal RESET, a first terminal thereof is electrically connected to the second output terminal OC, and a second terminal thereof is electrically connected to the first reference signal terminal VSS. A control terminal of the fourth transistor M4 is electrically connected to the second node PD, a first terminal thereof is electrically connected to the second output terminal OC, and a second terminal thereof is electrically connected to the first reference signal terminal VSS.

According to some embodiments of the disclosure, the pull-down control circuit 106 comprises a seventh transistor M7, an eighth transistor M8, a ninth transistor M9, and a tenth transistor M10. A control terminal of the seventh transistor M7 is electrically connected to a second terminal of the ninth transistor M9, a first terminal of the seventh transistor M7 is electrically connected to the third clock signal terminal CLKB, and a second terminal of the seventh transistor M7 is electrically connected to the second node PD. A control terminal of the eight transistor M8 is electrically connected to the first node PU, a first terminal of the eighth transistor M8 is electrically connected to the second node PD, and a second terminal of the eighth transistor is electrically connected to the first reference signal terminal VSS. A control terminal and a first terminal of the ninth transistor M9 are electrically connected to the third clock signal terminal CLKB, and the second terminal of the ninth transistor M9 is electrically connected to a first terminal of the tenth transistor M10. A control terminal of the tenth transistor M10 is electrically connected to the first node PU, the first terminal of the tenth transistor M10 is electrically connected to the second terminal of the ninth transistor M9, and a second terminal of the tenth transistor M10 is electrically connected to the first reference signal terminal VSS.

According to some embodiments of the disclosure, the first reset circuit 107 comprises an eleventh transistor M11 and a twelfth transistor M12. A control terminal of the eleventh transistor M11 is electrically connected to the reset signal terminal RESET, a first terminal of the eleven transistor M11 is electrically connected to the first node PU, and a second terminal of the eleventh transistor M11 is electrically connected to the first reference signal terminal VSS. A control terminal of the twelfth transistor M12 is electrically connected to the second node PD, a first terminal of the twelfth transistor M12 is electrically connected to the first node PU, and a second terminal of the twelfth transistor M12 is electrically connected to the first reference signal terminal VSS.

According to some embodiments of the disclosure, the second reset circuit 108 comprises a thirteenth transistor M13 and a fourteenth transistor M14. A control terminal of the thirteenth transistor M13 is electrically connected to the second node PD, a first terminal of the thirteenth transistor M13 is electrically connected to the first output terminal OUTPUT, and a second terminal of the thirteenth transistor M13 is electrically connected to the first reference signal terminal VSS. A control terminal of the fourteenth transistor M14 is electrically connected to the reset signal terminal RESET, a first terminal of the fourteenth transistor M14 is electrically connected to the first output terminal OUTPUT, and a second terminal of the fourteenth transistor M14 is electrically connected to the first reference signal terminal VSS.

Figure 4A:
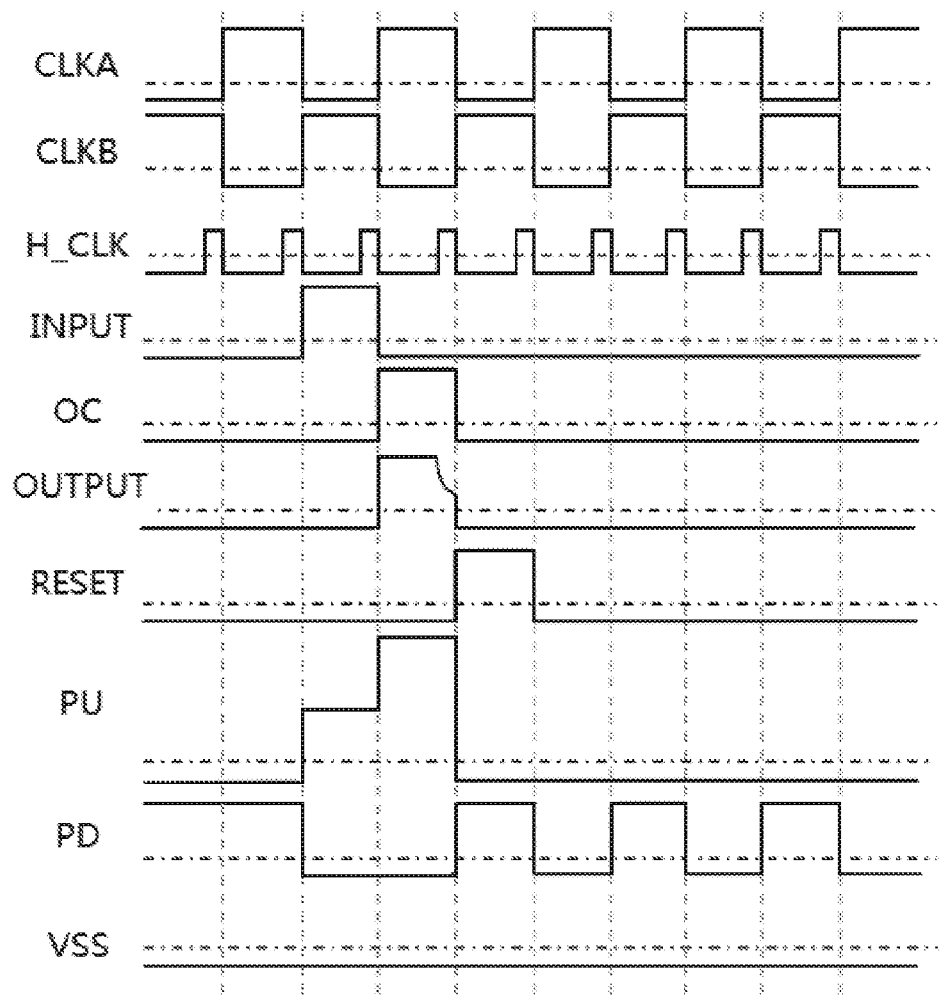
FIGS. 4A and 4B are schematic views each illustrating driving timing of a shift register unit provided by an embodiment of the present disclosure.
Figure 4B:
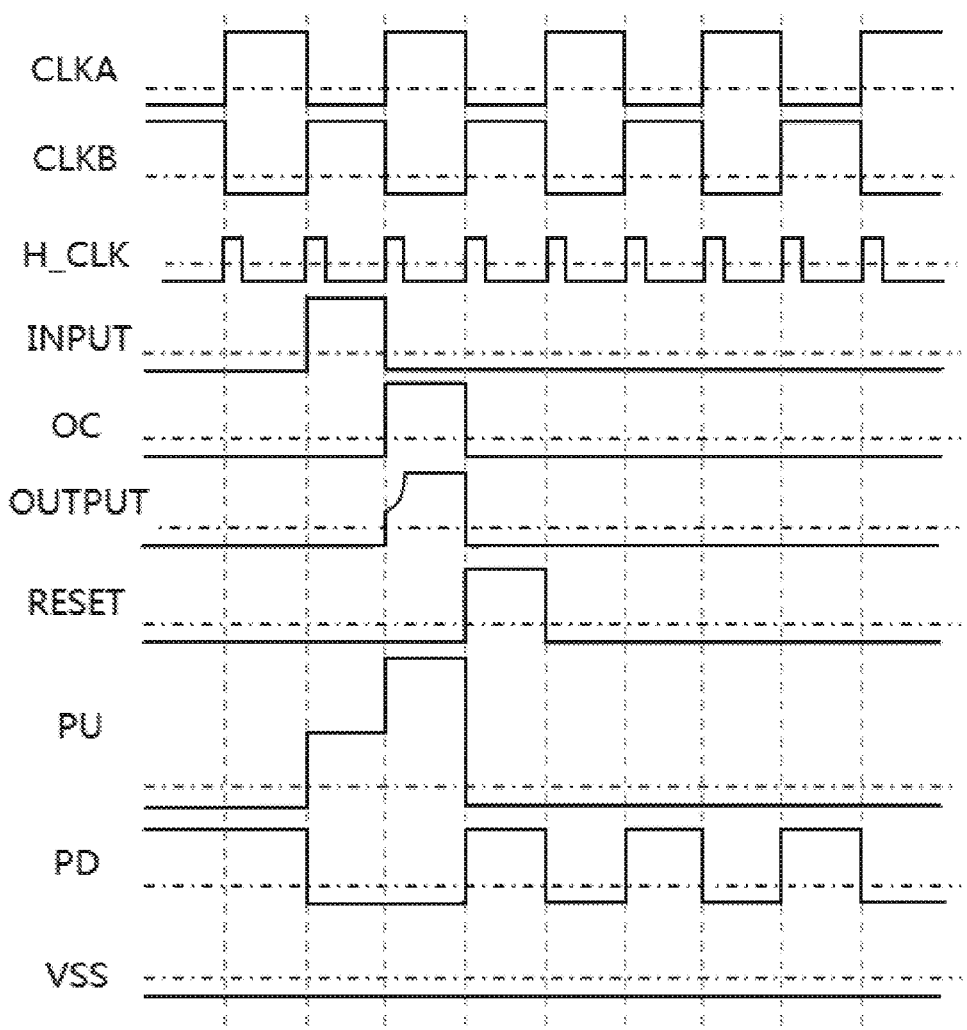

FIGS. 4A and 4B are the schematic views each illustrating driving timing of the shift register unit provided by an embodiment of the present disclosure. The driving method for the shift register unit in FIG. 3 will be described below with reference to FIGS. 3, 4A and 4B.

In a first phase (input phase), when the input signal of the input terminal INPUT is at a high level, the fifth transistor M5 is turned on, and the potential of the first node PU rises to a high level. When the level of the input signal becomes low, the fifth transistor M5 is turned off.

In a second phase (output phase), the high potential of the first node PU is continuously maintained due to the presence of the capacitor C. At that time, the sixth transistor M6 is turned on, the first clock signal terminal CLKA inputs a first clock signal to generate a first output signal at the first output terminal OUTPUT. At that time, due to the bootstrap action of the capacitor C, the potential of the first node PU continues to rise.

After the first output signal is being outputted for a period of time, the second clock signal inputted at the second clock signal terminal H_CLK reaches the amplitude of an effective level (for example, the amplitude is ½ of the amplitude of the first clock signal), the first transistor M1 is turned on, and the first reference signal is provided to the first output terminal OUTPUT via the first transistor M1. Since the polarity of the first reference signal is opposite to that of the first output signal (in the examples of FIGS. 4A and 4B, the first reference signal is a negative signal, the first output signal is a positive signal), the first output signal of the first output terminal OUTPUT will be partially offset by the first reference signal at that time to form a chamfer, as shown in FIGS. 4A and 4B. Therefore, in this embodiment, the first output signal adjustment circuit is also referred to as a chamfering circuit.

In a third phase (resetting phase), the reset signal inputted at the reset signal terminal RESET is at a high level, and the first node PU and the first output terminal OUTPUT are discharged to the level of the first reference signal terminal VSS, thereby realizing resetting.

In a fourth phase (denoising phase), when the third clock signal CLKB is at a high level, the voltage of the second node PD rises. Thus, the electrical signals of the first node PU and the first output terminal OUTPUT are pulled down to the level of the first reference signal, and the first node PU and the first output terminal OUTPUT are de-noised and maintained in a low level. There is a difference between the denoising phase and the reset phase. The reset signal of the reset signal terminal RESET is to actively pull the signals of the first node PU and the first output terminal OUTPUT from a high level to a low level in the reset phase, whereas in the denoising phase, the electrical signals of the first node PU and the first output terminal OUTPUT are maintained in a low level state. In an example, the display period for one frame image is 16.67 ms, the time taken by the first three phases is only about 135 μs, and the remaining time is the working time of the pull-down control circuit 106 (denoising unit).

According to an embodiment of the disclosure, since the first output signal has been chamfered, in order to ensure that the electrical signal of the first node PU in a next stage shift register unit would be not affected by the regulated first output signal, in the example of FIG. 3, the shift register unit further comprises a second output circuit 104 for generating a second output signal as an input signal to the next stage shift register unit. When the first node PU is at a high level, the second transistor M2 is turned on, and the output second output signal is consistent with the first output signal that is not chamfered. In addition, the third reset circuit 105 in the shift register unit can discharge and denoise the second output terminal OC.

According to embodiments of the present disclosure, as shown in FIGS. 4A and 4B, the amplitude of the effective level of the second clock signal H_CLK is smaller than that of the effective level of the first clock signal CLKA, for example, the amplitude of the effective level of the second clock signal H_CLK is half of the amplitude of the effective level of the first clock signal CLKA. Moreover, the duty cycle of the second clock signal H_CLK is smaller than that of the first clock signal CLKA. Therefore, during a time period in which the second clock signal H_CLK is at an effective level, the amplitude of the first output signal can be effectively decreased, so that the transition voltage ΔVp for the display device can be effectively reduced, which alleviates the phenomena such as flickers, broken images, and the like that may occur in the display device upon image display, thereby improving the display quality of the display device.

In some embodiments, the duty cycle of the second clock signal H_CLK is 0.1%-10% of the duty cycle of the first clock signal CLKA, and the amplitude of the effective level of the second clock signal is ⅙-⅔ of the amplitude of the effective level of the first clock signal. For an FHD (full high definition) display screen, the period of the first clock signal is generally about 90 μs, whereas the time required for chamfering to a COF (chip on film) or COG (chip on glass) display product is usually set to be 1-5 μs. Therefore, the duty cycle of the second clock signal can be set to be (1-5 μs)/90 μs of the duty cycle of the first clock signal, that is, 1.11%-5.56%.

According to an embodiment of the disclosure, the amplitude of the effective level of the second clock signal is half of the amplitude of the effective level of the first clock signal, and the duty cycle of the second clock signal is 1% of the duty cycle of the first clock signal, so that the first output signal can be well chamfered, thereby improving the display quality of the display device. Of course, in practical applications, the amplitude and the duty cycle of the effective level of the second clock signal can be adjusted as needed, which are not limited to the values given in embodiments of the disclosure.

As shown in FIG. 4A, according to an embodiment of the disclosure, at least part of the falling edges of the effective level of the second clock signal H_CLK are synchronized with the falling edges of the effective level of the first clock signal CLKA. In this way, amplitude decrease can be performed in the late portion of the first output signal period, that is, the first output signal is chamfered at the late portion. It can be understood that, alternatively, in another embodiment of the present disclosure, as shown in FIG. 4B, at least part of the rising edges of the effective level of the second clock signal H_CLK are synchronized with the rising edges of the effective level in the first clock signal CLKA. In this way, amplitude decrease can be performed in an early portion of the first output signal period, that is, the first output signal is chamfered at the early portion.

Figure 5:
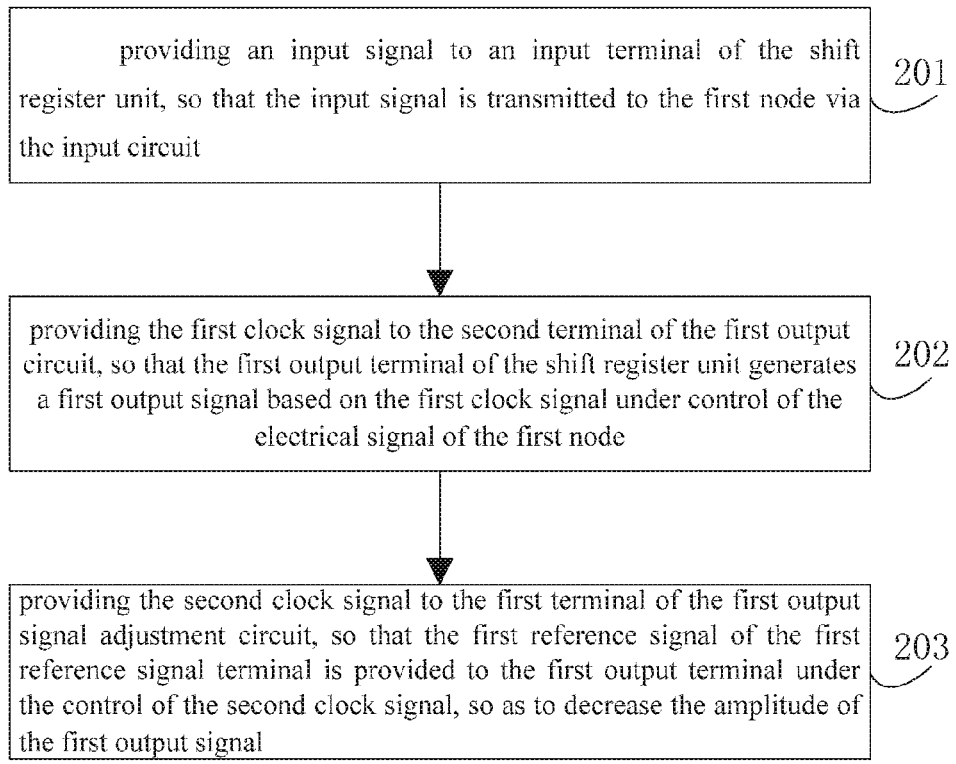
FIG. 5 is a flow chart of a control method for a shift register unit provided by an embodiment of the present disclosure.

According to a second aspect of the present disclosure, there is proposed a control method for a shift register unit, which can improve the quality of displayed images to some extent. FIG. 5 is a schematic flow chart of a control method for a shift register unit provided by an embodiment of the disclosure.

Referring to FIGS. 1 and 5, the control method for a shift register unit is used for driving the shift register unit described in any of the foregoing embodiments, which comprises the following steps:

S201: providing an input signal to an input terminal of the shift register unit, so that the input signal is transmitted to the first node via the input circuit;

S202: providing the first clock signal to the second terminal of the first output circuit, so that the first output terminal of the shift register unit generates a first output signal based on the first clock signal under the control of the electrical signal of the first node;

S203: providing the second clock signal to the first terminal of the first output signal adjustment circuit, so that the first reference signal of the first reference signal terminal is provided to the first output terminal under the control of the second clock signal, so as to decrease the amplitude of the first output signal.

According to an embodiment of the present disclosure, the amplitude of the effective level of the second clock signal is smaller than that of the effective level of the first clock signal, and the duty cycle of the second clock signal is smaller than that of the first clock signal.

Control of a shift register unit using the control method provided by the adjustment circuit to effectively decrease the amplitude of the first output signal (for example, the waveform of the first output signal is chamfered), the transition voltage ΔVp for the display device can be effectively reduced, which alleviates the phenomena such as flickers, broken images, and the like that may occur in the display device upon image display, thereby improving the display quality of the display device.

Figure 6:
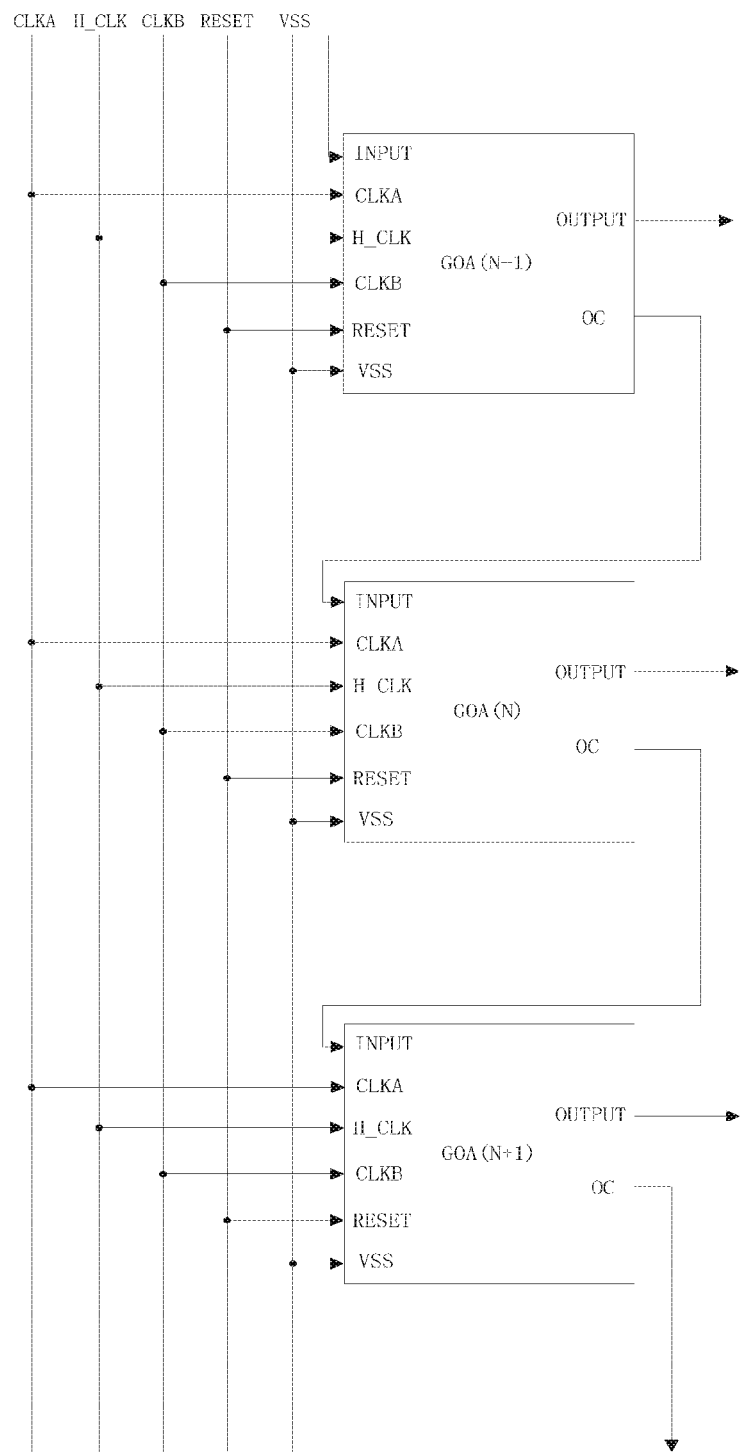
FIG. 6 is a schematic structural view of a gate driving device provided by an embodiment of the present disclosure.

According to a third aspect of the present disclosure, there is proposed a gate driving device, which can improve the quality of displayed images to some extent. FIG. 6 shows a schematic structural view of a gate driving device provided by an embodiment of the present disclosure.

The gate drive device comprises a plurality of cascaded shift register units as described in any of the foregoing embodiments.

In particular, in some embodiments, the shift register unit comprises a second output circuit 104, a first terminal of which is used for receiving the first clock signal, a second terminal of which is electrically connected to the first node, and a third terminal of which is electrically connected to the second output terminal of the shift register unit, for outputting the second output signal at the second output terminal based on the first clock signal under the control of the electrical signal of the first node. In the multiple cascaded shift register units, the second output terminal of an N-th stage shift register unit is electrically connected to the input terminal of a (N+1)-th stage shift register unit. For example, as shown in FIG. 6, the second output terminal OC of an N-th stage shift register unit is electrically connected to the input terminal INPUT of a (N+1)-th stage shift register unit. In this way, the second output circuit 104 can output a second output signal that is not chamfered to a next stage shift register unit, which ensures that the input signal of the next stage shift register unit is not affected.

Another aspect of the present disclosure proposes an array substrate comprising the gate driving device described in any of the foregoing embodiments.

A further aspect of the present disclosure proposes a display device comprising the array substrate described above.

The display device in this embodiment may be any product or component having a display function, such as an electronic paper, a mobile phone, a tablet computer, a television, a notebook computer, a digital photo frame, a navigator, and the like.

It is to be noted that the transistors in the foregoing embodiments may be selected from any one of a polysilicon thin film transistor, an amorphous silicon thin film transistor, an oxide thin film transistor, and an organic thin film transistor, or a field effect transistor or other devices having the same characteristics may be selected. The "control terminal" mentioned herein may specifically refer to the gate or base of a transistor, the "first terminal" may specifically refer to the source or drain (emitter) of the transistor, and the corresponding "second terminal" specifically may refer to the drain or source (collector) of the transistor. Of course, those skilled in the art should be aware that the "first terminal" and the "second terminal" may be interchanged.

In addition, the above embodiments are all described taking an N-type transistor as an example, but this will not limit the technical solution of the present disclosure. Those skilled in the art should appreciate that technical solutions in which the type (N-type or P-type) of the transistors is simply changed, and the positive/negative polarity of the voltages of respective power supply terminals and control signal lines are changed so as to realize the same turn-on or turn-off operation on the transistors as this embodiment fall within the scope of the application. For details, no more examples are given here.

In embodiments of the present disclosure, for an N-type transistor, a first terminal is the source and a second terminal is the drain. For a P-type transistor, a first terminal is the drain and a second terminal is the source.

It should be understood by those ordinarily skilled in the art that what have been described above are merely specific embodiments of the present disclosure and are not intended to limit the scope of the application, and that any modification, equivalent substitution, improvement, etc. made within the spirit and principle of the present disclosure should be included in the scope of the application.

What is claimed is:

1. A shift register unit comprising:
   an input circuit comprising a first terminal electrically connected to an input terminal of the shift register unit and a second terminal electrically connected to a first node, wherein the input circuit is configured to receive an input signal from the input terminal and configured to control an electrical signal of the first node based on the input signal;
   a first output circuit comprising a first terminal electrically connected to the first node, a second terminal configured to receive a first clock signal, and a third terminal electrically connected to a first output terminal of the shift register unit, wherein the first output circuit is configured to output a first output signal at the first output terminal based on the first clock signal responsive to the electrical signal of the first node;
   a first output signal adjustment circuit comprising a first terminal configured to receive a second clock signal, a second terminal electrically connected to the first output terminal, and a third terminal electrically connected to a first reference signal terminal,
   wherein the first output signal adjustment circuit is configured to provide a first reference signal of the first reference signal terminal to the first output terminal responsive to the second clock signal to decrease an amplitude of the first output signal,
   wherein a polarity of the first reference signal is opposite a polarity of the first output signal,
   wherein the first output signal adjustment circuit comprises a first transistor, and wherein a control terminal of the first transistor is configured to receive the second clock signal, a first terminal of the first transistor is electrically connected to the first output terminal, and a second terminal of the first transistor is electrically connected to the first reference signal terminal,
   wherein an amplitude of an effective level of the second clock signal is less than an amplitude of an effective level of the first clock signal, and a duty cycle of the second clock signal is less than a duty cycle of the first clock signal, and
   wherein a plurality of rising edges of the second clock signal are synchronized with rising edges of the first clock signal.

2. The shift register unit according to claim 1, wherein the shift register unit further comprises:
   a second output circuit,
   wherein the second output circuit comprises a first terminal configured to receive the first clock signal, a second terminal electrically connected to the first node, and a third terminal electrically connected to a second output terminal of the shift register unit, and
   wherein the second output circuit is configured to output a second output signal at the second output terminal based on the first clock signal responsive to the electrical signal of the first node.

3. The shift register unit according to claim 2, wherein the second output circuit comprises:
   a second transistor,
   wherein a control terminal of the second transistor is electrically connected to the first node,
   wherein a first terminal of the second transistor is configured to receive the first clock signal, and
   wherein a second terminal of the second transistor is electrically connected to the second output terminal.

4. The shift register unit according to claim 1, wherein the input circuit comprises:
   a fifth transistor,
   wherein a control terminal and a first terminal of the fifth transistor are both electrically connected to the input terminal, and
   wherein and a second terminal of the fifth transistor is electrically connected to the first node.

5. The shift register unit according to claim 1,
   wherein the first output circuit comprises a sixth transistor and a capacitor,
   wherein a control terminal of the sixth transistor is electrically connected to the first node,
   wherein a first terminal of the sixth transistor is configured to receive the first clock signal,
   wherein a second terminal of the sixth transistor is electrically connected to the first output terminal,
   wherein a first terminal of the capacitor is electrically connected to the first node, and
   wherein a second terminal of the capacitor is electrically connected to the first output terminal.

6. The shift register unit according to claim 1, wherein the shift register unit further comprises:
   a pull-down control circuit comprising a first terminal electrically connected to a second node, a second terminal configured to receive a third clock signal, a third terminal electrically connected to the first reference signal terminal, and a fourth terminal electrically connected to the first node,
   wherein the pull-down control circuit is configured to generate an electrical signal of the second node responsive to the electrical signal of the first node so that the electrical signal of the second node is equal to the third clock signal or the first reference signal.

7. The shift register unit according to claim 6,
   wherein the pull-down control circuit comprises a seventh transistor, an eighth transistor, a ninth transistor, and a tenth transistor,
   wherein a control terminal of the seventh transistor is electrically connected to a second terminal of the ninth transistor,
   wherein a first terminal of the seventh transistor is configured to receive the third clock signal, wherein a second terminal of the seventh transistor is electrically connected to the second node, wherein a control terminal of the eighth transistor is electrically connected to the first node, wherein a first terminal of the eighth transistor is electrically connected to the second node, wherein a second terminal of the eighth transistor is electrically connected to the first reference signal terminal, wherein a control terminal and a first terminal of the ninth transistor is configured to receive the third clock signal, wherein the second terminal of the ninth transistor is electrically connected to a first terminal of the tenth transistor, wherein a control terminal of the tenth transistor is electrically connected to the first node, and wherein a second terminal of the tenth transistor is electrically connected to the first reference signal terminal.

8. The shift register unit according to claim 6, wherein the shift register unit further comprises:

a first reset circuit that has a first terminal configured to receive a reset signal, a second terminal electrically connected to the first node, a third terminal electrically connected to the second node, and a fourth terminal electrically connected to the first reference signal terminal, wherein the first reset circuit is configured to reset the first node with the first reference signal responsive to the electrical signal of the second node and the reset signal.

9. The shift register unit according to claim 8, wherein the first reset circuit comprises:

an eleventh transistor and a twelfth transistor, wherein a control terminal of the eleventh transistor is configured to receive the reset signal, wherein a first terminal of the eleventh transistor is electrically connected to the first node, wherein a second terminal of the eleventh transistor is electrically connected to the first reference signal terminal, wherein a control terminal of the twelfth transistor is electrically connected to the second node, wherein a first terminal of the twelfth transistor is electrically connected to the first node, and wherein a second terminal of the twelfth transistor is electrically connected to the first reference signal terminal.

10. The shift register unit according to claim 6, wherein the shift register unit further comprises:

a second reset circuit comprising a first terminal electrically connected to the second node, a second terminal electrically connected to the first output terminal, a third terminal configured to receive the reset signal, and a fourth terminal electrically connected to the first reference signal terminal, wherein the second reset circuit is configured to reset the first output terminal with the first reference signal responsive to the electrical signal of the second node and the reset signal.

11. The shift register unit according to claim 10, wherein the second reset circuit comprises a thirteenth transistor and a fourteenth transistor, wherein a control terminal of the thirteenth transistor is electrically connected to the second node, wherein a first terminal of the thirteenth transistor is electrically connected to the first output terminal, wherein a second terminal of the thirteenth transistor is electrically connected to the first reference signal terminal, wherein a control terminal of the fourteenth transistor is configured to receive the reset signal, wherein a first terminal of the fourteenth transistor is electrically connected to the first output terminal, and wherein a second terminal of the fourteenth transistor is electrically connected to the first reference signal terminal.

12. The shift register unit according to claim 6, wherein the shift register unit further comprises a third reset circuit comprising a first terminal electrically connected to the second output terminal, a second terminal electrically connected to the second node, a third terminal configured to receive the reset signal, and a fourth terminal electrically connected to the first reference signal terminal, wherein the third reset circuit is configured to reset the second output terminal with the first reference signal responsive to the electrical signal of the second node and the reset signal.

13. The shift register unit according to claim 12, wherein the third reset circuit comprises a third transistor and a fourth transistor, wherein a control terminal of the third transistor is configured to receive the reset signal, wherein a first terminal of the third transistor is electrically connected to the second output terminal, wherein a second terminal of the third transistor is electrically connected to the first reference signal terminal, wherein a control terminal of the fourth transistor is electrically connected to the second node, wherein a first terminal of the fourth transistor is electrically connected to the second output terminal, and wherein a second terminal of the fourth transistor is connected to the first reference signal terminal.

14. A gate driving device comprising a plurality of cascaded shift register units comprising the shift register unit according to claim 1.

15. The gate driving device according to claim 14, wherein a first one of the cascaded plurality of shift register units further comprises:

a second output circuit comprising a first terminal configured to receive the first clock signal, a second terminal electrically connected to the first node and a third terminal electrically connected to a second output terminal of the shift register unit, wherein the second output circuit is configured to output a second output signal at the second output terminal based on the first clock signal responsive to the electrical signal of the first node, wherein a second output terminal of a N-th stage shift register unit among the cascaded plurality of shift register units is electrically connected to an input terminal of a (N+1)-th stage shift register unit.

16. A display device comprising the gate driving device according to claim 14.

* * * * *